United States Patent [19]
Johnston

[11] Patent Number: 4,631,519
[45] Date of Patent: Dec. 23, 1986

[54] POSITION MEASURING APPARATUS

[75] Inventor: James S. Johnston, Bognor Regis, England

[73] Assignee: Rosemount Engineering Company Limited, England

[21] Appl. No.: 606,814

[22] PCT Filed: Sep. 1, 1983

[86] PCT No.: PCT/GB83/00215
§ 371 Date: Apr. 20, 1984
§ 102(e) Date: Apr. 20, 1984

[87] PCT Pub. No.: WO84/01027
PCT Pub. Date: Mar. 15, 1984

[30] Foreign Application Priority Data
Sep. 1, 1982 [GB] United Kingdom ................ 8224888

[51] Int. Cl.⁴ .............................................. H03M 1/22
[52] U.S. Cl. .................................................. 340/347 P
[58] Field of Search ...................................... 340/347 P

[56] References Cited
U.S. PATENT DOCUMENTS

| | | | |
|---|---|---|---|
| 3,702,471 | 11/1972 | Kennedy et al. | 340/347 |
| 3,746,842 | 7/1973 | Fowler | 340/347 |
| 4,071,818 | 1/1978 | Krisst | 324/208 |
| 4,074,258 | 2/1978 | Doré et al. | 340/347 P |
| 4,112,295 | 9/1978 | Dubik et al. | 250/237 |

FOREIGN PATENT DOCUMENTS

| | | |
|---|---|---|
| 0039921 | 5/1981 | European Pat. Off. . |
| 3035774 | 9/1980 | Fed. Rep. of Germany . |
| 1511044 | 5/1975 | United Kingdom . |

OTHER PUBLICATIONS

Jones, B. E. and K. Zia., *Digital Displacement Transducer Using Pseudo-Random Binary Sequences and a Micro Processor*, in IMEKO/IRAC, Symposium Proceedings, London, Nov. 1980, pp. 368 to 379.

Primary Examiner—L. T. Hix
Assistant Examiner—David M. Gray
Attorney, Agent, or Firm—Kinney & Lange

[57] ABSTRACT

The relative position of two elements is measured by reading a coded strip 11 fixed to one of the elements. The strip 11 carries code elements in a pseudo-random binary sequence (PRBS) which can be read by a photodetector array 15. The array 15 and suitable optics if necessary enable enough successive code elements of the PRBS to be read simultaneously to identify the position along the PRBS. The array 15 has several detecting elements for each code element or bit of the PRBS, so that the fine position of transitions or markings of the PRBS can be measured within one PRBS bit length. A comparator 17 compares the output of the array 15 with a portion of the PRBS from a PRBS generator 21. The generated PRBS is serially shifted through a register 18 and a counter 22 stores the number of shifts needed until a match is found. Applications are described in micrometers, pressure sensors, shaft encoders and others.

23 Claims, 14 Drawing Figures

POSITION MEASURING APPARATUS

The present invention is concerned with position measuring apparatus for providing a measure of the relative position of two members movable relative to one another in a predetermined path. Embodiments of the invention may be applicable to a wide range of instruments in which such relative position measurements must be made.

Digital transducers are known which enable displacement along a digitised track to be measured. Commonly, the track comprises of a regular series of digitiser elements, or bits, and the displacement along the track is measured by counting the number of bits. For such arrangements to measure the position along the track, a record must be kept of the count from a predetermined datum. This record can be lost in the event of power failure. Furthermore, some modification of the basic arrangement is required to accommodate two-directional movement along the track so that the counter can be incremented or decremented appropriately.

Alternative digital transducer arrangements employ absolute digital encoding of successive positions along the length of a track. Such a system has limitations in terms of the length of the track which can be covered given the size of digital word representative of each position along the track. Furthermore, only the predetermined coded positions can be recorded so that the accuracy of positional measurement is limited.

The possibility of measuring the present position of a *moving* member relative to a track is discussed by B. E. Jones and K. Zia in the paper entitled "Digital Displacement Transducer Using Pseudo-Random Binary Sequences and a Micro Processor" in IMEKO/IFAC, Symposium Proceedings, London, November 1980, pages 368 to 379. The system discussed by Jones and Zia enables relatively long digitiser tracks to be employed but necessarily involves movement of the moving member relative to the track in order for the position along the track to be identified. Furthermore, the system is capable of measuring the relative positions only to the accuracy of the digitiser bit spacing along the track. In a pseudo-random binary sequence (PRBS) having a total length of P bits, any group of a predetermined number r of consecutive bits, P being larger than r gives a unique pattern and hence defines the position of the group within the sequence.

U.K. Patent Specification No. 1511044 discloses a PRBS on a long perforated strip with means for reading the markings during relative movement of two members.

In U.K. No. 1284641, there is disclosed position measuring apparatus using markings in a PRBS on one member with means on a relatively movable member to scan mechanically the sequence of markings and hence to determine the relative position of the two members. Interpolation between successive coded increments is performed using a second ruled scale and a reference grating.

It is an object of the present invention to provide an improved position measuring apparatus which can determine the relative position of two members, which may be stationary during operation by scanning a PRBS but which can interpolate between the elements of the PRBS.

According to the present invention, position measuring apparatus for providing a measure of the relative position of two members movable relative to one another in a predetermined path comprises code elements on one of said members distributed among locations spaced parallel to said path of relative movement to define a predetermined sequential pattern of said locations in a pseudo-random binary sequence (PRBS) in which indexed positions corresponding to successive said spaced locations along the sequence are each identified by a unique binary word in a predetermined number of adjacent said locations, and detecting means, having sensing elements located on the other of said members, responsive to the code elements in at least said predetermined number of adjacent locations to read the unique binary work defined thereby to identify the corresponding indexed position along the sequence, said detecting means having a plurality of sensing elements for each of a plurality of locations to determine the fine position between adjacent indexed positions of at least one of said code elements relative to the detecting means by sensing transitions or edges of markings to define a code element or elements.

This apparatus typically employs a sequentially coded digitiser track having the characteristics known for pseudo-random binary sequences, i.e. the position along the sequence can be identified by the unique word defined by a determined number of adjacent bits. However, any sequence having this feature can be used in the present invention including sequences in addition to those classically recognised as pseudo-random binary sequences. The detecting means may sense merely the predetermined number of elements to identify a unique location. Preferably however the sensing means senses more than the necessary number of bits; by doing so, protection can be obtained, by the redundant information, from errors from, for example dust or dirt on the code elements etc.

In the above apparatus, the detecting means with the pickup is arranged to enable a sufficient number of adjacent bits along the sequence to be read so as always to provide the unique binary work defining the position along the sequence. Thus, movement of the one member relative to the other is not required to enable the position to be identified.

Furthermore, the detecting means, by having a plurality of sensing elements for each coded element and being responsive to edges or transitions, can additionally read the fine position of an index mark so that the relative positions of the two members can be measured to a greater accuracy than the bit spacing of the binary sequence.

The apparatus operates in effect to measure a local datum point, referred to previously as an indexed position and defined by the unique binary word along the sequence, and also to perform a fine measurement to record the position relative to the local datum point. In this way, the absolute relative position of the two members can be measured with considerable accuracy whilst still employing one set of coded elements or marks on one member and one array of sensing elements on the other member.

Said index marks may be constituted by transitions between at least some adjacent said locations. For example, said index marks may be constituted by transitions between a said location with a code element and an adjacent location without a code element. For example, in an embodiment using optical techniques, a transition between a "1" and "0" on the sequentially coded track can readily be identified. A conventional binary code, for example one having a mark for a "1" and a space for a "0" has no edges or transitions in a sequence of 1's or a sequence of 0's. To increase the number of edges or transitions, other codes may be employed, e.g. a Manchester code in which a "0" is signified by a space followed by a mark and a "1" is signified by a mark followed by a space. Every digit requires both a space and a mark and thus every digit has a transition.

Said detecting means may be arranged to read the fine position of the coded elements, and hence of the sequence relative to the pickup between index positions, before reading the binary work to identify the index position. This arrangement may simplify the process of reading the binary word since the fine position reading enables the location of the bits defining the binary word of the coded track to be predetermined to simplify the reading operation.

Preferably, said detecting means comprises a linear array of sensing elements with a length sufficient to read a length of code element sequence defining the binary word but with a spatial definition high enough to identify the fine position.

Thus, said detecting means may comprise an array of detectors arranged parallel to said path of relative movement and each responsive to the presence or absence of markings defining a code element in a respective said spaced location, the array being of sufficient length to sense the number of code elements required to define a unique position in the PRBS and there being a plurality of detectors in the length of each code element so that, in at least one code element, the position of an edge or transition of markings within the code element can be sensed whereby the detectors in the array provide outputs defining not only the unique binary word but also the fine position of at least one said transition relative to the array.

To accomplish the above, and using a PRBS in which N successive elements are scanned, N being equal to or greater than the number of elements required to define a unique position, and in which n detectors are provided for each coded element, said detecting means may include a shift register having nN bit elements, the serial input of the shift register being supplied at a predetermined bit rate with a binary signal corresponding to said PRBS and the shift register being clocked at a rate n times faster than said predetermined bit rate of said binary signal, and means for comparing the contents of said shift register with the parallel output of the detector array and responsive to the closest match to indicate the measured position. The means for comparing the contents of said shift register may be a correlator providing an output signal indicative of the level of correlation between the shift register contents and the array output.

The apparatus may include a clock generating clock pulses for the shift register of the detecting means at said faster rate, a divider to divide said faster rate clock pulses by n, a sequence generating means responsive to said divided clock rate pulses to generate said binary signal at a bit rate equal to the divided rate, a counter counting said faster rate clock pulses and responsive to a closest match indication from said means for comparing to stop counting at a count indicative of the measured position.

The detecting means may include storage means to store a representation of said binary sequence and means for reading said binary sequence from the storage means for comparison with said unique binary word from the pickup to find the index position indentified thereby. Alternatively, the detecting means may include a sequence generator comprising a shift register having said predetermined number of bit elements and connected with logic feedback so as, when clocked, to produce at its serial output said predetermined pseudo-random binary sequence for comparison with said unique binary word from the pickup to find the index position identified thereby. In yet another arrangement, the detecting means comprise computing means arranged to perform equivalent functions.

The detectors for sensing the code elements may be optical detectors, e.g. photo-sensitive elements such as photo-diodes, co-operating with markings forming a PRBS and constituting code elements. The code elements may be opaque elements in a transparent strip or vice versa and, in this case, the detecting means may comprise a light source located on one side of the strip and photo detectors on the other side.

Instead, the detecting means may be capacitively arranged to detect variations in electrical capacitance resulting from said presence or absence of code elements. In the optical arrangement, optical enlarging means may be provided to focus an enlarged image of the code elements onto the photo detectors. Alternatively, a reduced image of the code elements may be focused onto the photo detectors.

The code elements may comprise regions of varying magnetic permeability and, in this case, the detecting means may comprise a magnet and magnetic field detectors.

In another arrangement using optically detectable code elements, the detecting means may comprise a television camera tube, means focusing an image of the code elements onto the tube and means responsive to a video output signal from the tube to read the unique binary word and detect its fine position.

In a specific further example, the code elements are magnetically detectable and the detecting means comprises a magnetic pole face extending parallel to said path to generate a magnetic field in the region of said predetermined number of adjacent spaced locations, a surface acoustic wave device arranged to launch surface acoustic wave pulses on said pole face in the direction of said path to cause localised perturbations of the magnetic field, said perturbations travelling along said path with the acoustic wave pulses, and magnetic field detecting means screened from said pole face by the code elements and responsive to said perturbations travelling past the code elements to provide a serial output signal representing the unique binary word.

It will be appreciated that if the binary sequence employed in the apparatus is relatively long, an excessive time may be taken by the apparatus in comparing the unique binary word read by the detecting means with the complete length of the binary sequence. Accordingly, for measuring successive relative positions of the members, the apparatus may include store means for storing the last identified indexed position and means responsive to the stored position to compare the latest unique binary word from the detector elements with binary words identifying indexed positions in a range including the stored position to find the new position. In this way, the apparatus will look for a match with the new binary word in the immediate vicinity of the last known indexed position.

Examples of the present invention will now be described with reference to the accompanying drawings in which.

The theory of generation of pseudo-random binary sequences (PRBS) is well established. The generation of such PRBS is a well established technology employing shift registers with specific arrangements of logic feedback. Normally the maximum non-repeating length of the PRBS generated by a shift register generator is limited by the number of "bit elements" or bistables used in the shift register. For example, the maximum length of sequence generated by n bistables is $N = 2^n - 1$. It will be appreciated that the contents of the shift registers of such a sequence generator correspond to the successive unique binary words representing the successive indexed positions along the sequence envisaged in embodiments of the present invention.

Figure 1:
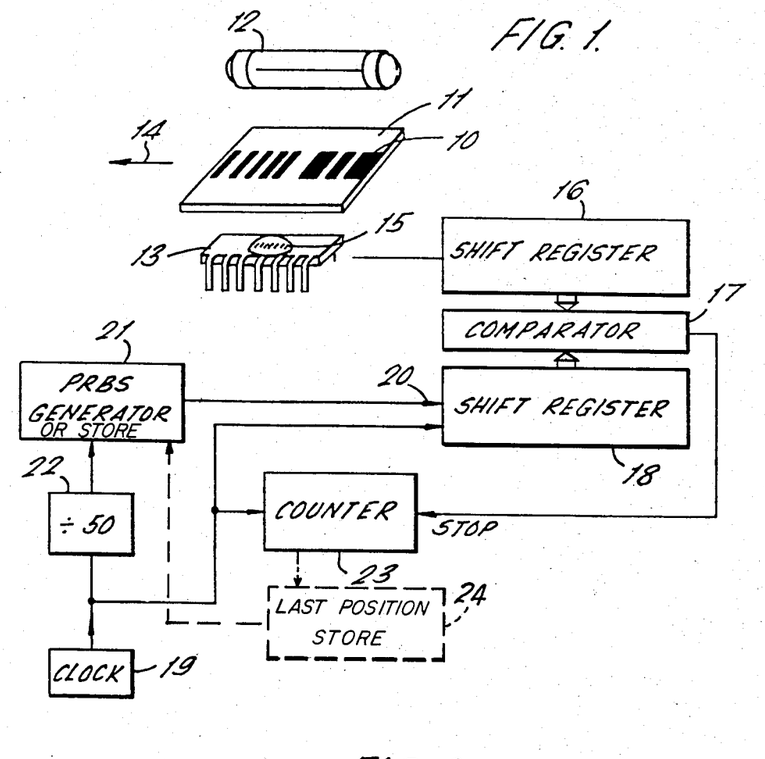
FIG. 1 is a schematic diagram illustrating an embodiment of the present invention employing an optically readable code element sequence.

Referring to FIG. 1, a PRBS is illustrated at 10 provided on a track 11. Only a short length of the track and PRBS is illustrated for simplicity. In this example, the code elements forming the PRBS 10 comprise opaque bars printed onto a transparent medium constituting the track 11. Where adjacent locations along the track 11 contain code elements, a thicker bar is shown.

The pickup employed in the FIG. 1 arrangement comprises a light source 12 on one side of the track 11 and a photo detector array 13 on the opposite side of the track. It will be appreciated that when used for measuring the relative positions of two members, the track 11 is fixed to one of the members and the pickup comprising light source 12 and detector array 13 is fixed to the other of the members such that relative movement of the members moves the track 11 relative to the pickup in the direction indicated by arrow 14. As will be apparent from the following description, no relative movement is required for the purpose of determining the position of one member relative to the other.

The photo detector array 13 may comprise a dual in-line package as illustrated, having a linear array of photo detectors at 15. The size of the code elements along the track 11 is shown out of scale relative to the detector array. In practice, the arrangement would be such that a shadow or image of sufficient adjacent code element locations along the track 11 is focused onto the photo detectors 15 to enable the unique binary word identifying the position along the PRBS to be read. It may be preferable however to make the array of detectors of a length to include one or two (or possibly more) code elements above the minimum number necessary to define the position. The extra information provides protection against errors, for example due to dust or dirt on the code elements or detectors.

In a possible example, the code element locations along the track 11 may be at intervals of, say, 0.5 mm. Thus, if five adjacent locations, or binary digits, is sufficient to define the binary word identifying the position along the code (true for a code length of 31 positions), the five digits would occupy 2.5 mm. A possible array 15 has 256 detectors at 10 $\mu$m spacing giving a useful length of 2.56 mm. (Arrays are available commercially with detector spacings of 7 $\mu$m or 13 $\mu$m, but a spacing of 10 $\mu$m is chosen in this example to simplify the arithmetic).

In order to read the output of the photo detector array device 13, this output is loaded into a shift register 16. The contents of the shift register 16 is then compared by a digital comparator 17 with the contents of a further shift register 18. The shift register 18 is clocked by pulses at a rate F from a clock 19. The serial input 20 of the shift register 18 is loaded with the predetermined pseudo-random binary sequence corresponding to that printed on the track 11 as generated by a PRBS generator or store 21. The PRBS generator or store 21 may be a store containing the entire PRBS or may include the usual shift register with logic feedback arranged to reproduce the desired PRBS in serial form. In the present example, a five element shift register is sufficient for the generator 21. The PRBS generator 21 is clocked by clock pulses at a rate F/50 from a divider 22. Thus the bit rate of the serial PRBS fed to the input of the shift register 18 is one-fiftieth of the clock rate applied to the shift register 18. It can be seen that this fraction corresponds to the relative spacing of the detectors in the photo detector array 15 and the code element locations in the PRBS 10 on the track 11.

With this arrangement, the shift register 18 continually shifts a representation of part of the PRBS in steps equivalent to the 10 $\mu$m spacing of the photo detectors.

A counter 23 counts the clock pulses from clock 19 fed to the shift register 18 and is stopped by a signal from the comparator 17 indicating a match between the contents of the shift register 18 and of the shift register 16. It can be seen, therefore, that the contents of the counter 23 when stopped following a match is indicative of the measured position along the track 11. Furthermore, the stop signal from the comparator 17 can be generated theoretically to an accuracy corresponding to the spacing of the detectors in the array 15, i.e. 10 $\mu$m, so that the contents of the counter at this time is a measure of the relative positions of the detector and track 11 to a corresponding accuracy. Thus, the illustrated arrangement operates to identify not only the binary word identifying the indexed position along the track 11 corresponding to successive code element locations of the track but also the "fine position" of the track to an accuracy dependent on the detector spacing in the array 15.

In practice, the comparator 17 may be embodied as a digital correlator which will provide an output signal in response to the best match between the contents of the shift registers 16 and 18. It will be appreciated that the accuracy of the correlator output is not excessively dependent on the accuracy of definition of the boundaries between code element locations along the PRBS on the track 11. Provided the track is accurately printed overall, ragged edges to the code elements, or even some local irregularity in their spacing should little effect the accuracy of the measurement. The height of the correlation peak produced by the comparator 17 may be somewhat reduced but its location should still accurately define the measured positions. The correlation output can be enhanced by arranging to read a longer section of the PRBS than strictly necessary to identify the unique binary word. This increases the number of scale marks (constituted by transitions between code elements and locations without code elements) over which the correlation is performed, so that distortions in some of the transitions, caused by bad printing, by dust or optical distortion for example, tend to cancel out.

Figure 2:
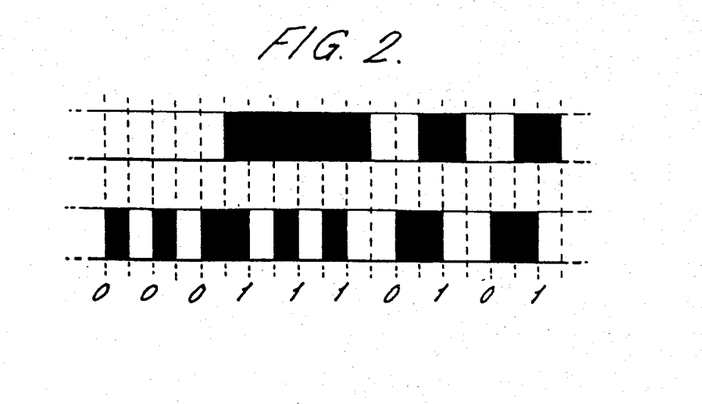
FIG. 2 is a diagram for explaining a coding system.

The fine position is determined, in the above example, by sensing the edges of markings, i.e. transitions between opaque and clear regions in the particular embodiment described. It will be appreciated that a continuous series of "1"s or a continuous series of "0"s would have no such transitions. Such a continuous series of unchanging digits does not provide a unique code but a few such unchanging digits in the PRBS reduces the number of transitions. However by the choice of a suitable coding pattern, it can be ensured, for example, that there is at least one transition in each digit. One such code is a Manchester code illustrated in FIG. 2. In this figure the upper line shows 10 code elements of a sequence in conventional form whilst the lower line shows these same elements in a Manchester code. In this example, a "0" is represented in the lower line by a clear region on the left of the code element and an opaque region on the right. A "1" is indicated by an opaque region on the left and a clear region on the right. There is thus a transition in each code element. Each single code element must have such a transition and thus there is no unresolvable ambiguity as to the position of start of each code element in the sequence.

Figure 3:
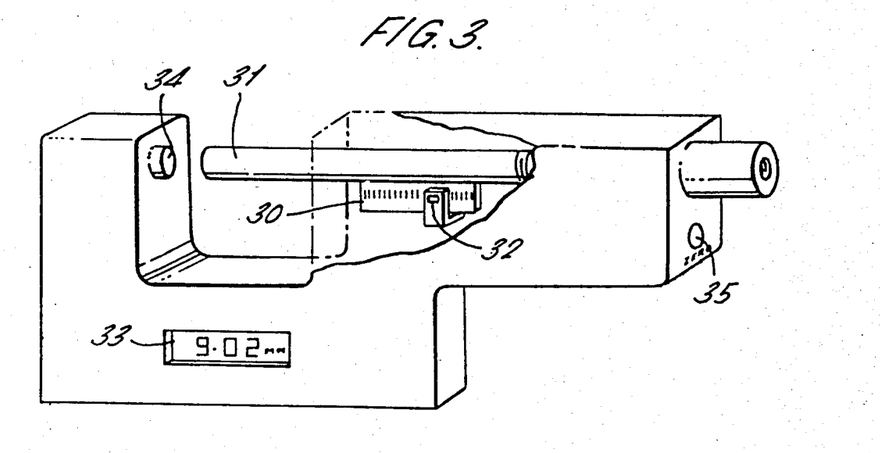
FIG. 3 is a perspective view, partially broken away, of a micrometer which may embody the position-measuring apparatus described with reference to FIG. 1.

The general principles of the example of the invention described above can be applied to a number of instruments where it is required to measure the position of one member relative to another. Referring to FIG. 3, there is shown a digital micrometer in which a PRBS track 30 is fixed to the spindle 31 and arranged to be read by a lamp and detector array assembly 32 fixed relative to the body of the instrument. The instrument may be arranged to include necessary electronics for performing the functions described with reference to FIG. 1 together with a battery to power these electronics. The measured reading of the micrometer may be displayed on a digital display 33.

In use, the micrometer is first closed by bringing the end of the spindle into contact with the anvil 34. Pressing a zero button 35 causes the transfer of the closed scale reading to memory. This stored figure is then subtracted automatically by the processing electronics of the instrument from all subsequent readings before display of the result. The same facility could be used to compare individual piece-parts with a standard by closing the jaws on the standard part, and pressing the zero button 35 so that thereafter the instrument reads positive and negative deviations from the standard.

Although the embodiment of the invention described with reference to FIG. 1 employs optical techniques, any other sensing technique could be used including magnetic, ultrasonic, capacitive or inductive. The lower power consumption usual for capacitive detection systems might make such a system desirable for use in the micrometer illustrated in FIG. 3 in which case the track 30 and array assembly 32 are modified to provide capacitive detection.

Figure 4:
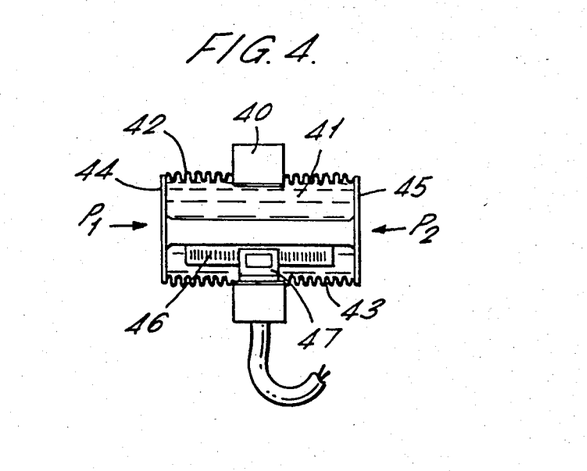
FIG. 4 is a cross-sectional view of a differential pressure transducer employing a position-measuring apparatus embodying the present invention.

Referring to FIG. 4, a pressure transducer is shown comprising a body 40 having central aperture 41 connected by bellows 42 and 43 to opposite pressure sensing plates 44 and 45. The plates 44 and 45 are interconnected by a tie rod 46 on which is mounted a track 46 carrying the PRBS code. A reading head 47 is mounted on the body 40. In this way, the deflection of the tie rod 46, representative of the difference between pressures $P_1$ and $P_2$ applied to the plates 44 and 45, can be measured.

If a detector array as described above with a detector spacing of 10 $\mu$m is used in the pressure transducer of FIG. 4 in order to obtain a resolution of 0.1%, the minimum range of relative movement between the track 46 and the head 47 is 10 mm. In order to accommodate a smaller range of movement, an optical system may be provided to focus a magnified image of the code element pattern on the track 46 onto the photo detector array. Thus, if, using photo lithographic techiques, the PRBS on the track 46 is reduced in size so that adjacent digit locations are at 10 $\mu$m intervals, and an image magnified 10 times is projected onto the array also with 10 $\mu$m spacing, the effective spatial resolution of the position measuring device would be 1 $\mu$m and a 0.1% discrimination can be achieved for a bellows displacement range of 1 mm.

Figure 5:
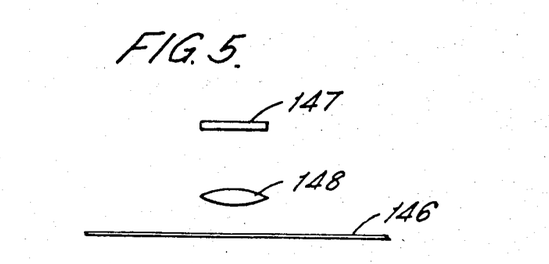
FIG. 5 illustrates apparatus using an optical magnifier.

Such a construction is illustrated diagrammatically in FIG. 5 where there is shown a PRBS on a track 146 and a detector array 147 with a lens system, indicated by a single lens 148, arranged to project a magnified image of the PRBS on the detector array.

It will be appreciated that this technique of focusing a magnified image of the PRBS onto the detecting array can be used in other instruments where increased resolution is required.

The principles of operation of examples of the invention discussed hitherto can also be applied to determining the positions of, e.g. the cutting tool, on a machine. However, a rather longer PRBS may be required to provide the necessary track length. For example, with a code element location spacing of 0.5 mm, a track length of 1 m would have 2,000 digit positions. Hence an eleven bit word would be required to identify the position along the track. The PRBS generator would accordingly require an 11 element shift register to synthesize the PRBS. Such an 11 bit PRBS could be provided which would not repeat in less than 2,047 steps and it would be necessary to read or image a length of at least 5.5 mm of the track to pick up the unique binary word identifying the indexed position along the track. This can be achieved with optical techniques using a photo detector array of 1,024 elements. Alternatively, an optical system may be provided to produce a reduced image (magnification times 0.5) onto a 256 element array. In the latter case the resolution would be plus or minus 20 μm.

Alternatively a finer spacing of code elements along the PRBS of the track of, say, 10 μm may be employed. This requires 100,000 indexed positions along a 1 m. track length. The unqiue binary word to define each position would have 17 bits requiring a minimum code length of 170 μm to be read. Such a code length could be projected optically onto a 256 element photo detector array at a magnification of about 15 times and would then give an effective spatial resolution for the apparatus of about 1.5 μm.

Using the processing circuitry illustrated in FIG. 1, the processing time required to identify the measured position using the above described 17 bit PRBS would be relatively long because of the time required to run through the entire PRBS for comparison with the output of the photo detector array. It would take 15×100,000 steps to shift the entire PRBS through shift register 18 of FIG. 1, so that, if the correlator used for comparator 17 is capable of of shift rates of 10 MHz, it would take 0.15 seconds to identify the position. Additional processing means may be included in the electronics to reduce this processing time. For example, the apparatus may include a store 24 (FIG. 1) containing the last identified position measurement. The PRBS generator can then be controlled in response to the last stored position to compare the newly-read detector array output with the part of the binary sequence immediately adjacent to the last position. This technique is based on the assumption that any subsequent position reading must be within a short distance of the previous reading.

Figure 6:
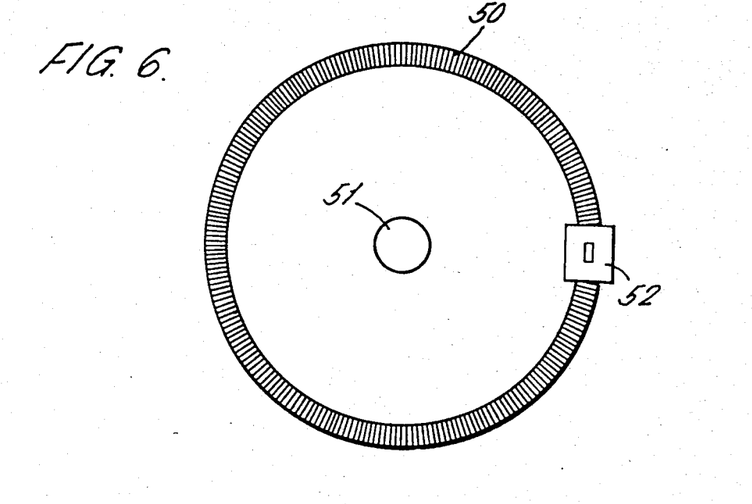
FIG. 6 illustrates the application of embodiments of the present invention to shaft encoders or rotary digitisers.

FIG. 6 illustrates the application of embodiments of the present invention to a rotary digitiser in which the PRBS track is provided as an annular track 50 on a coding disc rotatable about a shaft 51. The annular position of the disc relative to the shaft is read off by a stationary reading head 52. In such an arrangement it is preferrable to use a PRBS code which repeats on each revolution of the disc. Thus the annular track 50 may comprise 1,023 digit positions (indexed positions) in which is printed a 10 bit PRBS. To read the 10 bit unique position identifying word, an arc of 3.6° of the track must be read by the detector array in the reading head 52. Using the same arrangement as originally described with reference to FIG. 1, a 256 detector array would enable the angular position to be measured to about 1 minute of arc. It may be necessary in some circumstances to provide special arcuate arrays of detectors, or optical correction devices, to avoid distortion of the readings due to the non-straight line geometry of the track 50.

Without using optical magnification techniques, and with a detector array having 10 μm spacing between detectors, the track 50 could be printed on a digitiser disc of diameter 80 mm. Smaller discs may be employed using finer printed track 50 together with optical magnification.

Simple digitisers with very high precision can be produced in this way with applications in machine dividing heads, theodolites, sextants, and robotics etc.

Figure 7:
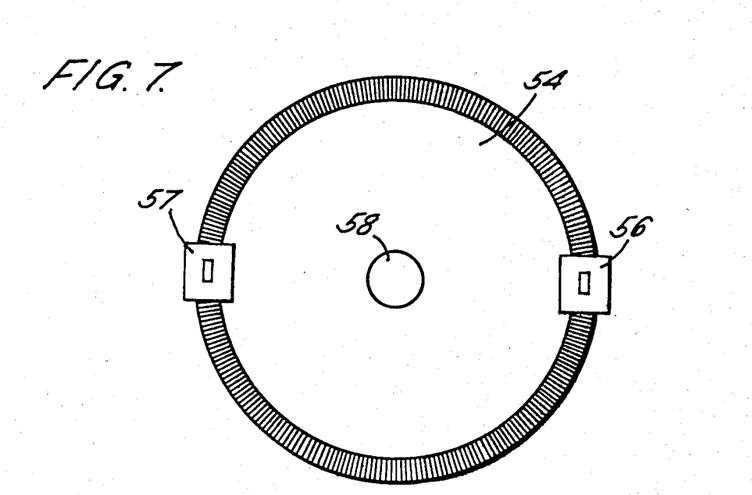
FIG. 7 shows a modification of the device of FIG. 6.

As shown in FIG. 7, a coding disc 54 with an annular PRBS track 55 may be used in conjunction with two detector arrays 56, 57 arranged 180° apart around the track. The purpose of this is to permit accurate angular measurements to be made despite any eccentricity in the mounting of the disc on its shaft 58 or lateral movement of the shaft in its bearings. Small movements of the disc or shaft along the line joining the two detectors 56, 57, i.e. a movement at right angles to the line of the detector arrays will have no effect on the readings. Movement however which has a component normal to the line joining the detectors 56, 57 will result in the reading from one detector increasing and the reading from the other detector decreasing by the same small amount. The average of the readings from the two detectors (with due allowance for the 180° spacing around the track) will give the actual angular position of the disc despite any eccentricity. The exact angular positions of the two detectors need not be known precisely since readings can be taken with the disc in a "zero" position and these can be used as the datum points for all future readings.

Figure 8:
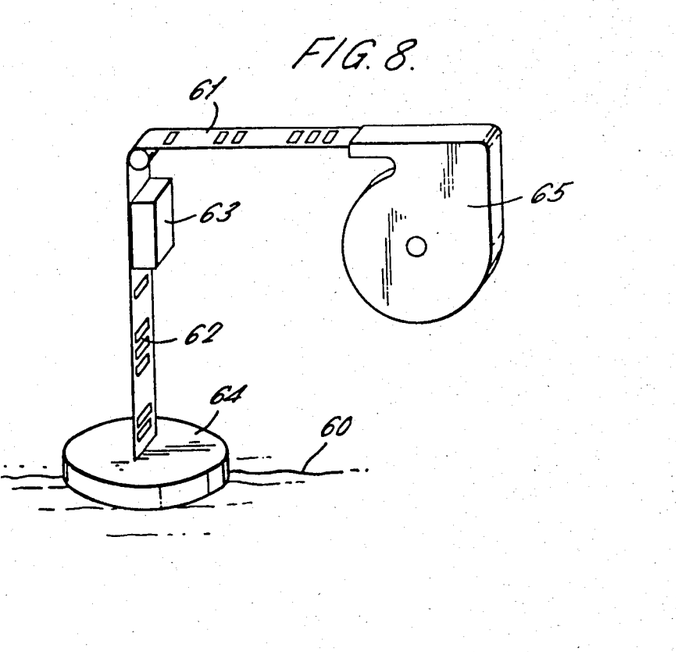
FIGS. 8 and 9 illustrate respectively the application of embodiments of the invention to liquid level measurement apparatus and to a plotting table.

FIG. 8 illustrates an application of an embodiment of the invention to a float and tape type level gauge. The level of the liquid 60, e.g. in a tank, is measured by monitoring the positions of a tape 61 provided with a PRBS coded track 62 relative to a fixed reading head 63. A lower end of the tape is attached to a float 64 so that the position read from the tape provides an indication of the liquid level. A take-up spool 65 may be provided to keep the tape 61 taut as the liquid level rises and falls.

In a particular example, digit positions along the tape may be at 5 mm intervals enabling levels up to 30 m. to be read with a 12 bit PBRS. Thus, the reading head 63 must read a minimum length of 60 mm of the track 62 on the tape. Optical techniques may be used as described above. However, if the tape is ferromagnetic, it may be more convenient to use an array of Hall effect magnetic field detectors.

Modifications of the abovedescribed arrangement can provide a surveyor's measuring tape with a PRBS coded track recorded on the tape in addition to the normal visible markings. The tape reading head and electronics may be contained in the spool housing and a digital readout provided on the housing.

Figure 9:
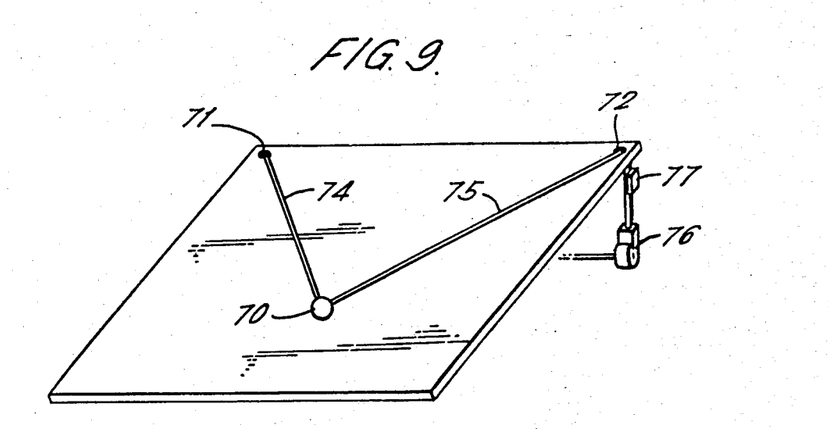

FIG. 9 shows an application of embodiments of the invention to a plotting table. A cursor 70 is connected to two datum points 71 and 72 on the plotting table 73 by lengths of string 74 and 75. Each of the lengths of string 74 and 75 may pass through an aperture through the plotting table 73 at its respective datum point 71, 72. The strings 74 and 75 are kept under tension by means of a spring-loaded takeup spool 76.

The lengths of each of the strings 74 and 75 may be measured automatically by a reading head 77 located beneath the plotting table and responsive to PRBS coding of the string by means of circumferential stripes. The coding of the string may be provided for optical reading by black and white markings on the string or for magnetic reading by magnetised and non-magnetised bands on the string.

More than two such strings may be employed in the plotting table embodiment of FIG. 9 to improve accuracy and to avoid ambiguity.

With a third string from a datum point not in the same line as datum points 71 and 72 the position of the curser 70 in three dimensions can be measured. Again, a fourth string may be used to avoid ambiguity.

It will be apparent that many other applications of embodiments of the present invention can be derived.

Figure 10:
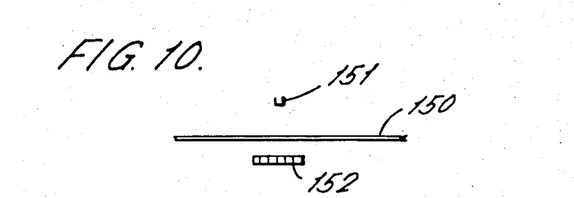
FIG. 10 shows an alternative sensing system.

Various alternative pickup techniques may be employed with examples of the present invention. In optical techniques, instead of employing a single light source simultaneously illuminating the required length of PRBS, together with an array of detectors, a scanned array of light sources (such as light-emitting diodes) may be employed arranged to cooperate with a single photo detector. Thus, the light-emitting diodes may be energised in sequence such that the output of the single photo detector is a serial signal representing a scan of the relevant section of PRBS. Such an arrangement is illustrated in FIG. 10 which shows, in side elevation, the edge of a transparent scale or disc 150 with a PRBS strip in the form of opaque and transparent markings, the strip of a section thereof being located between a single photo-diode 151 and an array of light emitting diodes 152, the array forming a line parallel to the PRBS strip and extending over a length thereof sufficient to define a unique code. The number of light emitting diodes 152 is greater, typically many times greater, than the number of code elements over the array so that the fine position can be determined as previously explained.

Similar modifications can be envisaged for magnetic and capacitive detecting methods.

In the above-described examples, the fine position of the code sequence relative to the reading head has been determined simultaneously with the indexed positions represented by the unique binary word. However, additional index marks may be provided alongside the pseudo-random binary sequence, with the index marks identifying successive code element locations of the sequence. For example, sprocket holes may be employed in the optical arrangement. The sprocket holes may be imaged onto one array of photo detectors and the PRBS onto another. Alternatively, the same array of photo detectors may be used for both sprocket holes and the PRBS in timed sequence with the respective light sources being switched on to illuminate the sprocket holes and the PRBS at appropriate moments. The positions of the sprocket holes relative to the array enables the positions of the code element locations relative to the reading head to be predetermined so that the binary word can be read out directly without the need for correlation techniques. A simple digital comparator may then be employed to compare the binary word with the PRBS to identify the indexed position. If this technique is employed in the example with a 17 bit PRBS the processing time for identifying the indexed position can be reduced from 150 ms to 10 ms. The transitions in the PRBS are still used for determining the fine position as desbribed above.

The advantages of the above technique may be obtained without the provision of separate sprocket holes. The photo detector array is used initially to identify a position along the length of the array of at least one transition between PRBS locations with and without code elements. By definition, there is always one such transition focused on the detector array for all positions of the PRBS. In this way the fine position of the array relative to the sequence track is again determined initially to enable only the relevant elements of the photo detector array to be read to identify the unique binary word representing the index position.

Figure 14:
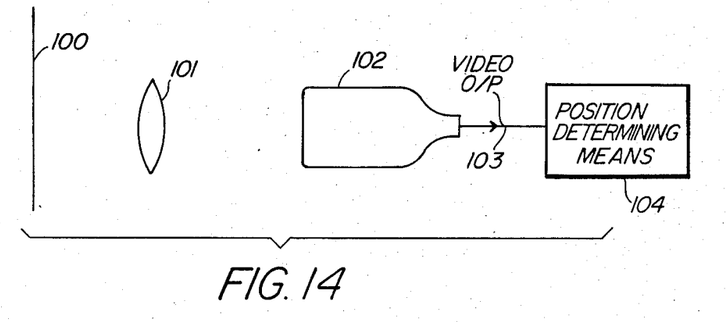
FIG. 14 is a schematic representation of a TV tube based detection system.

In all the examples of the invention described above, a length of the PRBS sequence is scanned in discrete steps. The sequence may be scanned by analogue techniques. In the optical example, an image of the PRBS may be formed on a television camera tube such as a videcon and the resulting pattern is then read out from a line scan of the tube as a serial signal. Referring to FIG. 14, a track 100 has optically detectable markings forming a PRBS and a lens 101 focuses an image of the markings onto the face of a television camera tube 102. A line scan of the tube then produces a video output signal on line 103 representing the imaged pattern as a serial signal. The video signal is supplied to position determining means 104 for determining the coarse and fine positions as before.

Figure 11:
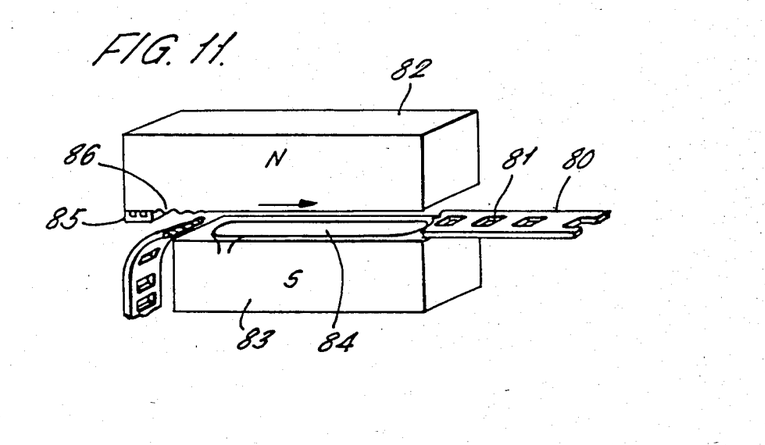
FIG. 11 is a schematic perspective view of a reading head or pickup for use in an embodiment of the present invention employing magnetically detectable code elements.

FIG. 11 illustrates a magnetic equivalent to the above. The ferromagnetic tape 80 having code elements formed as apertures 81 to provide the PRBS is passed between the poles 82, 83 of a permanent magnet forming part of the reading head. A coil of wire 84 is provided on the surface of one pole to extend along sufficient length of the PRBS to embrace the required number of adjacent bits in the sequence. A surface acoustic wave generator 85 is mounted at one end of the other pole 82 of the magnet on the opposing face of the pole and is arranged to launch along the surface of the pole surface acoustic wave pulses travelling along the pole in the direction of the tape 80. The surface acoustic wave pulse, illustrated at 86, produces a local perturbation of the magnetic field. This perturbation is picked up by the coil 84 only where it is not screened by the tape 80, i.e. only as the pulse 86 passes over a hole 81. In this way, a serial signal is produced representing the desired length of PRBS.

Figure 12:
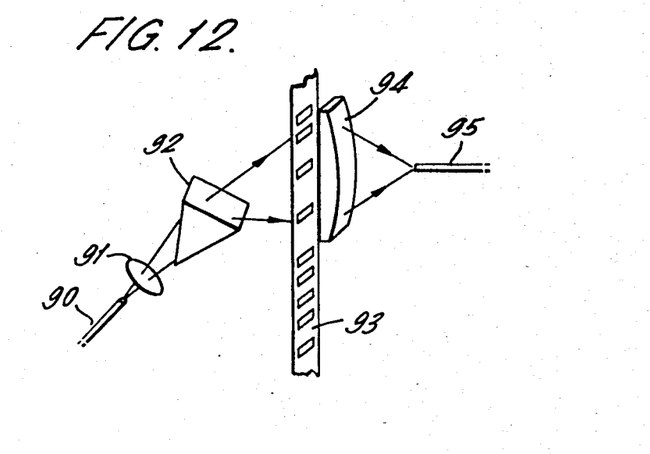
FIG. 12 is a view of an optical reading or pickup arrangement employing optical fibres and light dispersion.

FIG. 12 illustrates a further example employing spectral dispersion. Light from an optical fibre 90 is focused by a lens 91 through a prism 92 which disperses the light producing a spectrum on a track 93 carrying a PRBS. The spatial extent of the spectrum is arranged to embrace the desired length of PRBS containing sufficient bits to define the unique binary word. Only elements of the spectrum falling on an aperture in the track 93 pass through the track and are refocused by a lens 94 back into a further optical fibre 95. At a remote location, the light in the optical fibre 95 can again be dispersed to recreate the "image" of the portion of track 93. The above technique is specially useful for remote reading of the track 93 when this is desired to avoid the presence of electrical currents and voltage in the neighbourhood of the reading head.

Reference has been made to correlating the output of a detecting system with a PRBS sequence or an address code, and suitable digital signal correlators are well known and are commercially available. For the present purposes, it will generally be adequate to use simplified techniques rather than exact mathematical correlation techniques. For example, to determine a fine position using a plurality of edges or transitions, since these edges or transitions are spaced known distances apart, a "least squares" technique may be used to find the best fit to a straight line defining the positions of the transitions with respect to sensed data. Such techniques can readily be achieved by software programming of a data processor used as the comparator 21 or correlator of FIG. 1.

Figure 13:
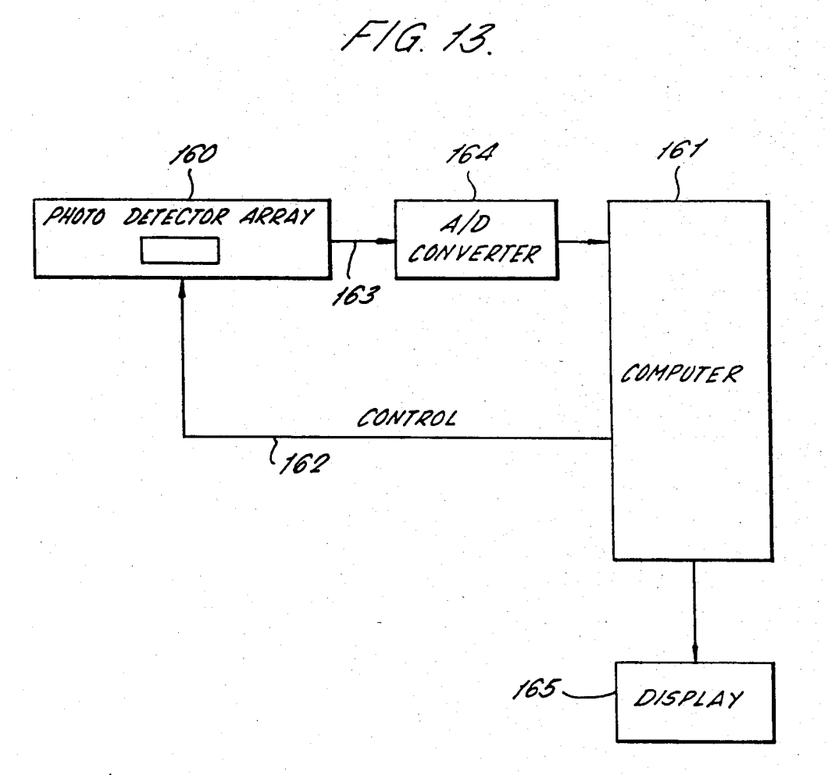
FIG. 13 shows a modification of the construction of FIG. 1.

FIG. 13 illustrates an arrangement incorporating a computer suitably programmed to perform various of the functions described previously as performed by discrete electronic circuits. The photo detector array corresponding to that illustrated in FIG. 1 is shown in FIG. 13 in block 160. A computer 161 generates control signals on a line 162 to the array 160 causing the array to generate on an output line 163 a series of voltage levels indicative in turn of the light intensities falling on the respective elements of the array. These voltage levels are converted in an analogue-to-digital converter 164 into a series of digital words fed to the computer 161 for storage in the computer memory. The computer then operates on these digital words to recreate from them the part of the PRBS detected by the detector array 160, to compare this part of the array with a corresponding complete PRBS held or generated by the computer and thereby to determine the coarse position along the PRBS and also to determine the fine position of transitions in the detected part of the PRBS relative to the array to the accuracy of the spacing of the elements in the array. The resultant measured distance along the PRBS comprising both the coarse measurement and the fine measurement, is then displayed on a display 165.

The sequence of steps performed in the computer 161 to achieve this result will now be described in more detail. In the first example the steps are described for analysing the output signals from the array 160 when used with an ordinary PRBS, ie. with a logic "1" indicated by the presence of a code element and a logic "0" indicated by the absence of a code element. The analogue-to-digital converter 164 is preferably an 8-bit converter producing 8-bit words corresponding to the voltage levels output from the array. Thus, computer 161 initially stores the series of 8-bit words in memory. For an array comprising 256 elements, the computer stores 256 8-bit bytes of data. Each byte represents the voltage output from one of the elements of the array, and therefore corresponds to one linear picture element (pixel).

The computer first converts the 256 bytes of data into 256 bits by comparing each byte with a threshold value and generating a logic "0" if the byte is below the threshold and a logic "1" if above the threshold.

A sequence is then generated of the numbers of the pixels at which occur transitions from logic "0" to logic "1" or from logic "1" to logic "0". These correspond to the number of the detector element along the array at which there is a transition in the image on the array of the PRBS.

The computer then calculates the average "period" that is to say the number of pixels covering the width of one bit of the PRBS. This number is not necessarily an integer. There will be a nominal period, say 14 pixels per bit, but slight variations in the setting up and geometry of the optical system used to focus the image of the PRBS on the array will tend to make the actual period slightly different from the nominal. The computer is arranged to perform a calculation to compensate for this small difference.

If the nominal period is supposed to be 14, the computer divides the difference between the numbers in the above sequence corresponding to the last and first transitions by the integer 14. With ideal setting up, this result should be an integer. However, normally, the result obtained is not an integer. The computer then takes the nearest integer to the result obtained and calculates the average period by dividing the difference between the outermost (ie last and first) transition numbers by this integer found.

In this stage the computer also stores the number of pixels from the beginning of the stored 256 bits to the first indicated transition as the "offset".

The computer then reconstructs the portion of PRBS detected by the array. This is done by using the calculated average period to examine each period between successive transitions and allocating to each period a logic "0" or a logic "1" depending on the value of bits found in the 256 bit series. That part of the offset in excess of a whole number of periods then represents the first, partly visible, bit of the PRBS detected by the array.

Finally, the reconstituted section of PRBS, the "window" is checked for match with the original PRBS by shifting the original PRBS generated by the computer along relative to the reconstituted section and counting the steps until a match is found. The number of steps taken, less the fraction of a step representing the partly visible bit remainder of the offset is then the distance of the window from the PRBS start expressed in PRBS-bit-widths units.

An alternative computer process will now be described for use with a Manchester coded PRBS. Initial computer steps are the same as for the ordinary PRBS upto and including the generation of the sequence of numbers at which transitions occur. It should be appreciated however that for a Manchester coded PRBS, there will be at least one transition for each code element of the PRBS detected by the array.

The computer then sorts the sequence of pixel numbers corresponding to transitions into those corresponding to single increments and those corresponding to double increments. This is done by comparing the spacing between successive transitions with a threshold value, those having a spacing less than the threshold being designated single increments and those above the threshold, double increments. It will be appreciated that the single increments represent transitions at a half bit spacing along the PRBS which occur when two bits of the same value follow each other in Manchester code. Double increments occur when a logic "0" is followed by a logic "1", or vice versa.

The computer then performs a least squares approximation to discover the best straight line relating transitions to the number of pixels along the array. In this process, a double increment increases the transition numbered by two and a single increment by one. The best straight line relationship between the transition number and pixel number then identifies constants which can be used to calculate the "period" ie. average width of PRBS bits in pixels (not necessarily an integer), and the "offset", ie. the fraction indicating how much of the first PRBS-bit is detected in the window.

The computer then reconstructs the "window" ie. the portion of PRBS detected, matches the reconstructed PRBS with the complete original PRBS generated by the computer by shifting along and counting the number of steps until the match is found, and calculates the distance from the PRBS beginning by subtracting the number of steps found by the calculated offset to produce a distance expressed in PRBS-bit-width units.

In the above, it is not necessary that the entire PRBS is held in computer memory.

The computer can be arranged to perform calculations equivalent to those known for generating pseudo-random binary sequences using shift registers with selected logic feedback. The computer can thus generate the PRBS sequentially, counting the number of steps needed to produce a section of PRBS code which matches the detected window.

In an alternative method, the N digits of the detected portion of PRBS are used by the computer as the address of the location in the computer store in which has been previously stored the corresponding numerical position of that section of the PRBS. This position read out of computer store is then compensated with the offset value to calculate the fine position.

It will be understood that, in all the embodiments described, the detecting system may be and preferably is arranged to sense a few more bits of the PRBS than are necessary as a minimum defining a unique code. The extra, redundant, information gives a measure of protection against possible errors due to dust or the like in the sensing system in defining the coarse position and ensures that extra data is available for defining the fine position.

I claim:

1. Position measuring apparatus for determining the relative position of two relatively movable members comprising markings forming regularly spaced code elements on one member extending in the direction of relative movement and defining a pseudo-random binary sequence (PRBS), and detecting means on the other member for sensing said markings, said detecting means being arranged to sense markings in a sufficient number of successive code elements, which number is less than the full length of the PRBS, to define a unique position along the PRBS and thereby give a coarse unambiguous position determination, and said detecting means further being arranged to sense the positions of transitions or edges of markings in a plurality of successive code elements to define a fine position within the length of a code element.

2. Position measuring apparatus as claimed in claim 1 wherein the detecting means are arranged to sense markings in the minimum number of successive code elements necessary to identify a unique location in the PRBS.

3. Position measuring means as claimed in claim 1 wherein the detecting means are arranged to sense markings in more than the minimum number of successive code elements necessary to identify a unique location in the PRBS.

4. Position measuring apparatus as claimed in claim 1 wherein the markings form at least one transition within each code element.

5. Position measuring apparatus as claimed in claim 1 wherein said detecting means is arranged to define said fine position before reading the markings to identify the coarse position.

6. Position measuring apparatus as claimed in claim 1 wherein said detecting means has high definition reading means to read said sufficient number of code elements at a spatial definition high enough to define also said fine position.

7. Position measuring apparatus as claimed in claim 6 wherein said detecting means comprises an array of detectors arranged to extend in a direction substantially parallel to the direction of relative movement and each detector being responsive to said markings, the array being of sufficient length to sense said sufficient number of code elements and there being a plurality of detectors in the length of each code element so that said positions of transition or edges of markings in the code elements can be sensed, whereby the detectors in the array provide outputs defining both the coarse position and said fine position.

8. Position measuring apparatus as claimed in claim 7 and using a PRBS in which N successive code elements are sensed, N being equal to or greater than the number of code elements required to define a unique position, and in which n detectors are provided for each code element, wherein said detecting means includes a shift register having nN bit elements, the serial input of the shift register being supplied at a predetermined bit rate with a binary signal corresponding to said PRBS and the shift register being clocked at a rate n times faster than said predetermined bit rate of said binary signal, and means for comparing the contents of said shift register with the parallel output of the detector array and responsive to the closest match to indicate the measured position.

9. Position measuring apparatus as claimed in claim 8 wherein said means for comparing the contents of said shift register is a correlator providing an output signal indicative of the level of correlation between the shift register contents and the detector array output.

10. Position measuring apparatus as claimed in claim 8 and including a clock generating clock pulses for the shift register of the detecting means at said faster rate, a divider to divide said faster rate clock pulses by n, a sequence generating means responsive to said divided clock rate pulses to generate said binary signal at a bit rate equal to the divided rate, a counter counting said faster rate clock pulses and responsive to a closest match indication from said means for comparing to stop counting at a count indicative of the measured position.

11. Position measuring apparatus as claimed in claim 1 wherein the detecting means includes storage means to store a representation of said PRBS and means for reading said PRBS from the storage means for comparison with the sensed markings of said sufficient number of code elements to find the coarse position identified thereby.

12. Position measuring apparatus as claimed in claim 11 wherein the detecting means includes a sequence generator comprising a shift register having a number of bit elements equal to said sufficient number of code elements and connected with logic feedback so as, when clocked, to produce at its serial output said PRBS for comparison with the sensed markings of said sufficient number of code elements to find the coarse position identified thereby.

13. Position measuring apparatus as claimed in claim 1 wherein said markings comprise alternating opaque and transparent portions in a strip to form the code elements and the detecting means comprises a light source located on one side of the strip and a plurality of photo detectors on the other side.

14. Position measuring apparatus as claimed in claim 1 wherein said markings comprise alternating opaque and transparent portions in a strip to form the code elements and the detecting means comprise a photo detector on one side of the strip and a plurality of light sources forming any array on the other side.

15. Position measuring apparatus as claimed in claim 14 wherein the light sources are light emitting diodes.

16. Position measuring apparatus as claimed in claim 1 wherein the markings comprise means to cause variation of electrical capacitance in direction of relative movement and detecting means is a capacitive sensor arranged to detect variations in electrical capacitance resulting from said markings.

17. Position measuring apparatus as claimed in claim 13 and including optical enlarging means to focus an enlarged image of the markings onto the photo detectors.

18. Position measuring apparatus as claimed in claim 13 and including optical reducing means to focus a reduced image of the markings onto the photo detectors.

19. Position measuring apparatus as claimed in claim 1 wherein said markings comprise regions of varying magnetic permeability and the detecting means comprises a magnet and magnetic field detectors.

20. Position measuring apparatus as claimed in claim 1 wherein said markings comprise magnetized regions and the detecting means comprises magnetic field detectors.

21. Position measuring apparatus as claimed in claim 1 wherein the markings are optically detectable and the detecting means comprises a television camera tube, means focusing an image of the markings onto the tube and means responsive to a video output signal from the tube to determine said coarse and said fine positions.

22. Position measuring apparatus as claimed in claim 1 wherein the markings are magnetically detectable and the detecting means comprises a magnetic pole face extending parallel to said direction of relative movement to generate a magnetic field in the region of said sufficient number of code elements, a surface acoustic wave device arranged to launch surface acoustic wave pulses on said pole face in said direction of relative movement to cause localized perturbations of the magnetic field, said perturbations traveling along in said direction with the acoustic wave pulses, and magnetic field detecting means screened from said pole face by the markings and responsive to said perturbations traveling past the markings to provide a serial output signal determining said coarse and said fine positions.

23. Position measuring apparatus as claimed in claim 1 for measuring successive relative positions of the members and including store means for storing binary words representing the last identified coarse position and means responsive to the stored position to compare the binary word representing the last identified coarse position sensed from the code elements with binary words identifying coarse positions in a range including the stored position to find the new coarse position.

* * * * *